US012701824B2

(12) United States Patent
Ali et al.

(10) Patent No.: US 12,701,824 B2
(45) Date of Patent: Aug. 4, 2026

(54) MICRO-LED AND METHOD OF MANUFACTURE

(71) Applicant: PORO TECHNOLOGIES LTD, Cambridge (GB)

(72) Inventors: Muhammad Ali, Cambridge (GB); Yingjun Liu, Cambridge (GB); Tongtong Zhu, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 781 days.

(21) Appl. No.: 17/759,250

(22) PCT Filed: Jan. 22, 2021

(86) PCT No.: PCT/GB2021/050147
§ 371 (c)(1),
(2) Date: Jul. 21, 2022

(87) PCT Pub. No.: WO2021/148803
PCT Pub. Date: Jul. 29, 2021

(65) Prior Publication Data
US 2023/0048093 A1 Feb. 16, 2023

(30) Foreign Application Priority Data

Jan. 22, 2020 (GB) .................................... 2000951

(51) Int. Cl.
*H10H 20/01* (2025.01)
*H10H 20/812* (2025.01)
(Continued)

(52) U.S. Cl.
CPC .... *H10H 20/817* (2025.01); *H10H 20/01335* (2025.01); *H10H 20/812* (2025.01);
(Continued)

(58) Field of Classification Search
CPC ........... H10H 20/817; H10H 20/01335; H10H 20/812; H10H 20/814; H10H 20/8162;
(Continued)

(56) References Cited

U.S. PATENT DOCUMENTS

2010/0140629 A1 6/2010 Lee et al.
2017/0237234 A1* 8/2017 Han ...................... H01S 5/1042
372/45.012
(Continued)

FOREIGN PATENT DOCUMENTS

CN 107946417 A 4/2018
JP 2007-27298 A 2/2007
(Continued)

OTHER PUBLICATIONS

International Search Report and Written Opinion of PCT/GB2021/050147, Apr. 9, 2021, 15 pages.

*Primary Examiner* — Elias Ullah
(74) *Attorney, Agent, or Firm* — MERCHANT & GOULD P.C.

(57) ABSTRACT

A method of manufacturing a micro-LED comprises the steps of forming an n-doped connecting layer of III-nitride material over a porous region of III-nitride material, and forming an electrically-insulating mask layer on the n-doped connecting layer. The method comprises the steps of removing a portion of the mask to expose an exposed region of the n-doped connecting layer, and forming an LED structure on the exposed region of the n-doped connecting layer. A method of manufacturing an array of micro-LEDs comprises the step of removing a portion of the mask to expose an array of exposed regions of the n-doped connecting layer, and forming an LED structure on each exposed region of the n-doped connecting layer. A micro-LED and array of micro-LEDs are also provided.

23 Claims, 8 Drawing Sheets

(51) Int. Cl.

| | |
|---|---|
| *H10H 20/814* | (2025.01) |
| *H10H 20/816* | (2025.01) |
| *H10H 20/817* | (2025.01) |
| *H10H 20/825* | (2025.01) |
| *H10H 29/14* | (2025.01) |

(52) U.S. Cl.
CPC ...... *H10H 20/814* (2025.01); *H10H 20/8162* (2025.01); *H10H 20/825* (2025.01); *H10H 29/14* (2025.01)

(58) Field of Classification Search
CPC ...... H10H 20/825; H10H 29/14; H10H 20/01; H10H 20/0137; H10H 20/032; H10H 20/8215; H10H 20/83; H10H 29/142; H01L 25/0753
See application file for complete search history.

(56) References Cited

U.S. PATENT DOCUMENTS

| | | | |
|---|---|---|---|
| 2019/0123235 A1 | 4/2019 | Cho et al. | |
| 2020/0227255 A1 | 7/2020 | Zhu et al. | |

FOREIGN PATENT DOCUMENTS

| | | |
|---|---|---|
| JP | 2009-21361 A | 1/2009 |
| JP | 2014-127708 A | 7/2014 |
| JP | 2018-533847 A | 11/2018 |
| KR | 1020130136088 A | 12/2013 |
| WO | 2018189205 | 10/2018 |
| WO | 2019/063957 | 4/2019 |
| WO | 2019/145728 | 8/2019 |

* cited by examiner

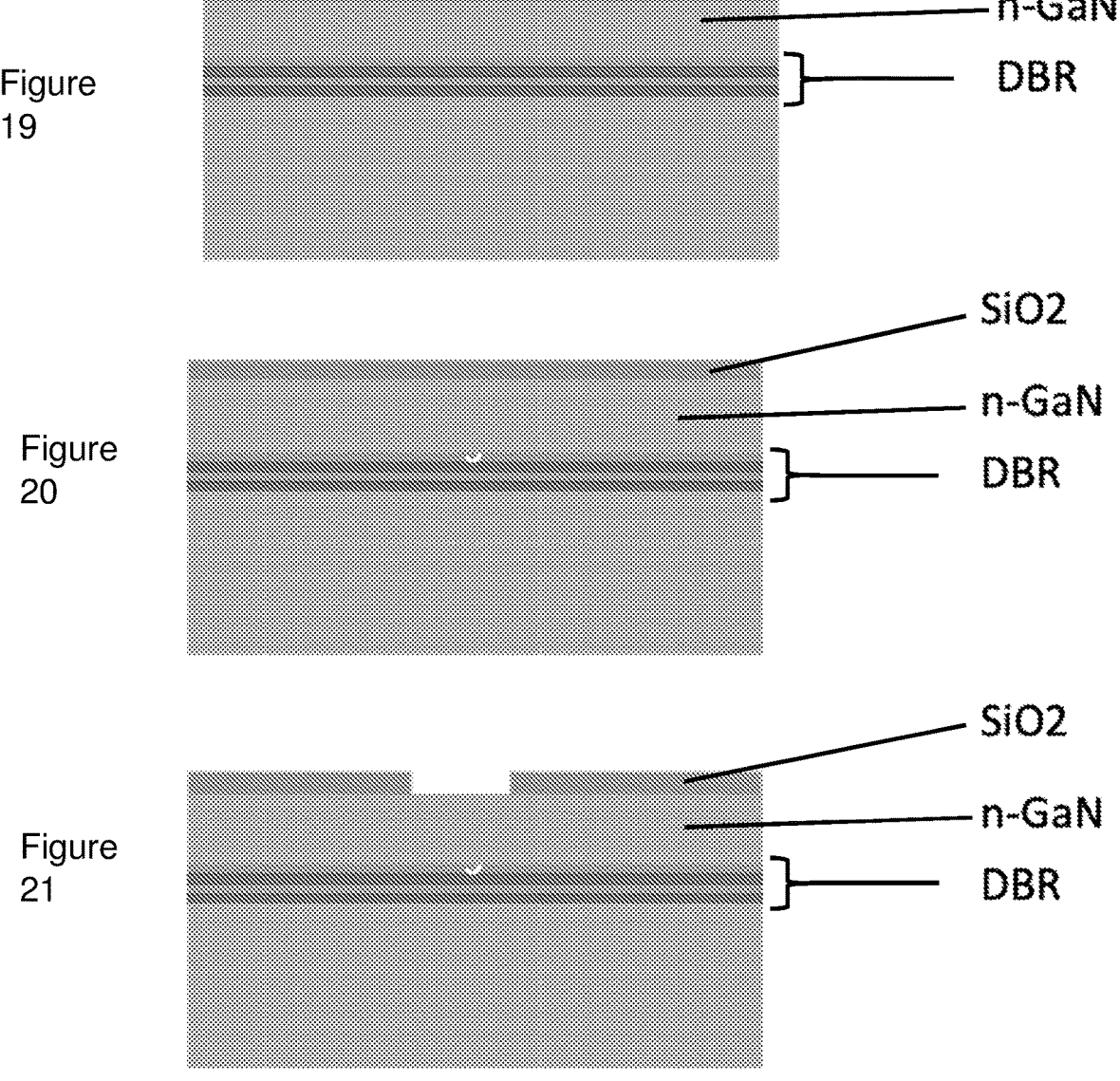
Figure
19
Figure
20
Figure
21

MICRO-LED AND METHOD OF MANUFACTURE

The present invention relates to semiconductor devices and a method of manufacture for semiconductor devices, in particular to micro-LEDs and an improved method of manufacturing micro-LEDs.

BACKGROUND

Standard light-emitting diodes (LEDs) for light emission are normally larger than 200 μm×200 μm. Micro-LEDs are arrays of micro-scale LEDs with high density with lateral size down to less than 100 μm×100 μm. So a micro-LED may be defined as an LED structure with lateral dimensions (Length and width) smaller than 100 μm×100 μm all the way down to a few tens of nanometers or even smaller.

In the past, attempts have been made to manufacture micro-LEDs using known techniques. For example, prior attempts have used normal LED epitaxy and laser lift-off, electrostatic carry, and elastomer stamp for the transfer. However, there are problems with applying this approach to devices as small as micro-LEDs.

These problems include:

Normal LED epitaxy is challenging for generating all three main colour (RGB) on the same chip of micro-LEDs.

Efficiencies are low for green and red micro-LEDs.

Dry etching is always needed to define micro-scale LED mesas. As LED sizes are smaller, plasma damage to the side wall of the LED structure will influence the emission efficiency and lifetime of the devices.

Laser lift-off is low yield and costly.

Transfer printing—low yield due to pre-existing strain/bow issues.

Due to these problems, conventional LED manufacture techniques are not satisfactory for the production of high quality micro-LEDs.

SUMMARY OF INVENTION

The present application relates to an improved method of manufacturing micro-LEDs, and to micro-LEDs made using that method. The present invention is defined in the independent claims, to which reference should now be made. Preferred or advantageous features of the invention are set out in the dependent sub-claims.

The micro-LED is preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AIN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index. The possibility of tuning the optical properties of GaN by altering its porosity therefore makes porous GaN of great interest for optoelectronic applications.

The present invention will be described by reference to GaN but may advantageously be applicable to alternative III-nitride materials.

Prior publications relating to the porosification of III-V semiconductor material include international patent applications PCT/GB2017/052895 (published as WO2019/063957) and PCT/GB2019/050213 (published as WO2019/145728).

The inventors have found that micro-LEDs and arrays of micro-LEDs can advantageously be provided using the present invention.

Method of Manufacturing a Micro-Led

According to a first aspect of the present invention there is provided a method of manufacturing a micro-LED, comprising the steps of:

forming an n-doped connecting layer of III-nitride material over a porous region of III-nitride material;

forming an electrically-insulating mask layer on the n-doped connecting layer;

removing a portion of the mask to expose an exposed region of the n-doped connecting layer; and forming an LED structure on the exposed region of the n-doped connecting layer.

Forming an electrically-insulating (dielectric) mask layer, and then removing a portion of the mask to expose an exposed region of the n-doped connecting layer, creates a template or "footprint" on which the LED structure of the micro-LED may be formed. The size and shape of the exposed region may be controlled by controlling the size and shape of the portion of the mask that is removed. Subsequent layers of semiconductor material may then be deposited onto the exposed region to form the LED structure. By controlling the size and shape of the exposed region, the lateral size (length and width) and shape of the subsequently-formed LED structure may be controlled. This size control is particularly advantageous for growing micro-LED structures with extremely small lateral dimensions.

In the prior art, large-scale LED structures are grown and then divided into micro-LEDs by etching channels to cut the structure into micro-scale platforms or "mesas" of the desired lateral size. In micro-LEDs made with such prior art techniques, etching damage to the sidewalls of the LED structure can have a significant effect on the tiny pixels formed by micro-LEDs. This can harm the reliability and brightness of the micro-LEDs.

The method of the present invention advantageously means that the LED structure of the micro-LED is formed in a pre-defined exposed region with the correct size and shape to form a micro-LED. As the exposed region in the present invention controls the footprint of the LED structure, the LED structure may advantageously be formed to an appropriate size in the first place, so there is no need to etch the LED structure of the present invention to reduce its lateral size. The resulting micro-LED therefore avoids any of the dry etching damage that occurs in prior art methods.

Avoiding dry-etching damage to the active layers of the micro-LED results in significant benefits compared to micro-LEDs prepared using prior art techniques, so that micro-LEDs made using the present method are advantageously more reliable and brighter.

Another benefit of the present invention is that it is straightforward to make an electrical n-contact with the n-doped portion of the LED structure, even for very small micro-LED structures of only a few microns in size. The present invention allows an n-contact to be made simply by removing a further portion of the electrically-insulating mask layer to expose a second exposed region on the n-doped connecting layer, and depositing a conductive contact on the second exposed region.

The step of forming the LED structure may comprise growing an LED structure according to conventional methods in the art. That is, the LED structure may be grown using known semiconductor deposition techniques and may have a variety of conventional LED epitaxial layers. While exemplary LED structures will be described herein by way of example, a large variety of LED structures (including various combinations of layer thicknesses, materials and doping levels) are known in the art and will be understood by the skilled person to be usable with the present invention. In the present invention, however, the LED structure is formed, grown or deposited only on the exposed region(s) of the n-doped connecting layer.

The step of forming the LED structure preferably comprises forming, on the exposed region of the n-doped connecting layer:

an n-doped portion;

a p-doped portion; and a light emitting region located between the n-doped portion and a p-doped portion.

The method of manufacturing a micro-LED may comprise a first step of electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728). This step should be carried out prior to forming the n-doped connecting layer of III-nitride material over the porous region, so that the connecting layer is not also electrochemically porosified.

The method may preferably comprise the step of forming the porous region of III-nitride material by electrochemical porosification through a non-porous layer of III-nitride material, such that the non-porous layer of III-nitride material forms a non-porous intermediate layer.

The non-porous intermediate layer may advantageously provide a smooth surface for overgrowth of the connecting layer, following which the intermediate layer is positioned between the porous region and the n-doped III-nitride connecting layer.

The porous region may be formed by porosifying one or more layers or regions of III-nitride material on a substrate. The substrate may be Silicon, Sapphire, SiC, β-Ga2O3. The crystal orientation of the substrates can be polar, semi-polar or non-polar orientation. The substrate thickness may typically vary between 100 μm and 1500 μm.

The porous region may be a porous layer, such that the method comprises the step of forming an n-doped connecting layer of III-nitride material over a porous layer of III-nitride material. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm², or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around 1/10 of a pixel (for example 0.1 μm), up to the lateral dimensions of the substrate itself.

A layer, or a stack of layers, of n-doped III-nitride semiconductor material is grown on the substrate. The III-nitride layer may contain one or a combination of these elements: Al, Ga, In (ternary of quaternary layer). The thickness of the III-nitride stack is preferably between 10-4000 nm. The III-nitride layer may have a doping concentration between $1 \times 10^{17}$ cm$^{-3}$-$5 \times 10^{20}$ cm$^{-3}$.

Preferably an intermediate layer of undoped III-nitride material is deposited over the doped material before it is porosified. The intermediate layer preferably have a thickness of between 1 nm and 3000 nm, preferably between 5 nm and 2000 nm.

In preferred embodiments, the doped region consists of an alternating stack of layers that are in a sequence of High/Low doping zones. The stack may consist of High/Low doping zone pairs, preferably wherein the stack contains between 5-50 pairs of layers. The thickness of each highly doped layer may vary between 10 nm-200 nm and low doped layers may have a thickness of between 5-180 nm.

As is known in the art, electrochemical porosification removes material from n-type doped regions of III-nitride materials, and creates empty pores in the semiconductor material.

In preferred embodiments, the n-doped connecting layer of III-nitride material is formed over a stack of multiple porous layers of III-nitride material. Thus, rather than being a single porous layer of III-nitride material, the porous region may be a stack of layers of III-nitride material in which at least some layers are porous.

The stack of porous layers may preferably be a stack of alternating porous and non-porous layers. Preferably the stack comprises between 5 and 50 pairs of porous and non-porous layers, stacked one on top of another. The porous layers may preferably have a thickness of between 10 nm and 200 nm, and the non-porous layers may preferably have a thickness of between 5 nm and 180 nm.

The porous region, or each porous layer in the porous region, may have a porosity of between 1% and 99% porous. Preferably the porous region, or each porous layer in the stack, has a porosity of between 10% and 90% porosity.

In a particularly preferred embodiment, the stack of porous layers comprises a porous Distributed Bragg Reflector (DBR), such that the method comprises the step of forming an n-doped connecting layer of III-nitride material over a porous DBR of III-nitride material. A porous DBR may be formed from a stack of alternating porous/non-porous layers, as the differing porosity between adjacent layers creates a difference in the refractive index of adjacent layers.

By controlling the thicknesses of the alternating porous/non-porous stack layers of III-nitride material, and the porosities of the porous layers, the optical properties of the DBR may be controlled to reflect particular wavelengths of light.

In a first preferred embodiment, the DBR may be configured to reflect light at the emission wavelength of the LED structure. This means that light emitted from the LED structure in the direction of the DBR is reflected back, increasing the amount of light that is emitted out of the micro-LED in the intended direction. This advantageously increases the brightness of the micro-LED.

In a second preferred embodiment, the DBR may be configured to transmit light at the emission wavelength of the LED structure, but to block transmission of another wavelength of light. The micro-LED may be configured so that the emission-direction of the device is through the DBR, so that the DBR acts as an optical filter through which light emitted by the LED structure must pass to exit the device. The DBR may then advantageously prevent transmission of unwanted wavelengths out of the LED device.

The DBR may advantageously be configured to provide >90% reflectivity or transmission for a desired wavelength of light. By varying the layer structure and thicknesses in the DBR, the reflectivity or transmission properties of the DBR may be tuned to different wavelengths. For example the reflectivity/transmission of the DBR may be tuned to provide >90% reflectivity/transmission for blue light at ~450 nm, or alternatively for green (520-540 nm) or red (615-640 nm) light.

The n-doped connecting layer of III-nitride material is grown over the region, preferably by deposition onto a non-porous intermediate layer.

The n-doped connecting layer of III-nitride material preferably has a thickness of between 200 nm and 2000 nm. The n-doped connecting layer of III-nitride material may preferably have an n-type charge carrier concentration of at least $1 \times 10^{18}$ cm$^{-3}$.

The mask layer is preferably formed by depositing a layer of dielectric material over the n-doped connecting layer of III-nitride material. Preferably the mask layer is deposited over the entire surface of the n-doped connecting layer of III-nitride material, so that the connecting layer is completely covered in dielectric material. The mask layer can be formed from SiO$_2$, SiN, SiON, AlO$_x$ or any other suitable dielectric material.

The mask layer may have a thickness of between 5 nm and 1000 nm, preferably between 200 nm and 800 nm, particularly preferably between 400 nm and 600 nm.

The mask layer may be deposited by conventional deposition techniques such as plasma-enhanced chemical vapor deposition (PECVD), sputtering, atomic layer deposition (ALD), evaporation or in-situ metal organic chemical vapor deposition (MOCVD).

Standard lithographic techniques may be used to remove portions of the mask layer, to create one or more openings in the non-conducting mask layer that expose regions of the n-doped connecting layer below. The step of removing a portion of the mask layer may involve wet etching or dry etching, for example inductively coupled dry etching (ICP-RIE).

The lateral size (length and width of the opening through the mask layer) and shape of the exposed region(s) controls the lateral size and shape of the LED structure to be grown in the exposed region.

The exposed region(s) of the connecting layer may be formed into any desired shape, and may be controlled by patterning and lithographically removing portions of the mask layer. For example, the exposed regions may be circular, square, rectangular, hexagonal, or triangular in shape.

The size of the exposed region should be the size of a micro-LED. For example, the exposed region may have a width and/or length (or diameter, if the exposed region is circular) of between 0.05 μm and 100 μm, preferably between 0.05 μm and 30 μm, particularly preferably less than 10 μm, for example between 0.1 μm and 10 μm or between 0.5 μm and 10 μm. In preferred embodiments the exposed regions may have a length, width or diameter of less than 50 μm, or less than 40 μm, or 30 μm, or 20 μm or 10 μm. Particularly preferably the exposed regions may have a width or diameter of less than 10 μm, so that the LED structures grown in the exposed regions form micro-LED pixels of less than 10 μm in size.

Once the exposed regions of the n-doped connecting layer have been formed in the dielectric mask layer, LED structures can be grown in the exposed regions, so that the LED structures are in contact with the n-doped connecting layer.

The lateral dimensions of the LED structure, including the n-doped portion, light-emitting region and p-doped portion, are preferably the same as that of the exposed region, as the LED structure is grown in the exposed region and inherits its lateral size. This means that micro-LEDs can be grown at an appropriate size without requiring an etching step to reduce the lateral dimensions of the LED structure.

A variety of LED structures may be grown in the exposed regions while obtaining the benefit of the present invention. All such LED structures typically comprise an n-doped portion, a light-emitting region and a p-doped portion, and optionally further layers of semiconductor material that are typical in LED epitaxy. Exemplary LED structures suitable for use in the present invention are described below.

In a preferred embodiment, the n-doped portion of the LED structure is grown on the exposed region of the connecting layer, so that the n-doped portion is in direct contact with the n-doped connecting layer.

The n-doped portion may comprise a first n-doped layer of III-nitride material, and preferably has a thickness of between 0.2 μm and 3 μm and an n-type doping concentration of at least $1 \times 10^{19}$ cm$^{-3}$.

The n-doped portion may comprise a second n-doped layer of III-nitride material over the first n-doped layer. The second n-doped layer may comprise a III-nitride layer containing Indium, or a stack of thin III-nitride layers with or without indium, or a bulk layer or stack of III-nitride layers with a variation in atomic percentage of indium across the layer or stack.

For example, the n-doped region may be a layer of n-GaN, or a layer of n-InGaN, or alternatively the n-doped region may be a stack of n-GaN/n-InGaN alternating layers, or a stack of n-InGaN/n-InGaN alternating layers having different quantities of indium in alternating layers.

The Indium atomic percentage in the second n-doped layer may vary between 0.5-25%. The total thickness of the second n-doped layer may vary between 2 nm-200 nm. If the second n-doped layer comprises a stack of layers, then the thickness of each individual layer in the stack may preferably vary between 1-40 nm.

The second n-doped layer of III-nitride material may have an n-type doping concentration between $1\times10^{17}$ cm$^{-3}$-5$\times$ $10^{20}$ cm$^{-3}$.

After growth of the n-type portion of the LED structure in the exposed region, the light-emitting region of the LED is overgrown on the n-type portion.

The light-emitting region may comprise one or more III-nitride light-emitting layers, preferably indium gallium nitride (InGaN) light-emitting layers. The light-emitting layer or each light-emitting layer preferably comprises a quantum well, or a nanostructured layer comprising quantum structures such as quantum dots, fragmented or discontinuous quantum wells.

The light-emitting layer or each light-emitting layer preferably comprises a III-nitride material with an atomic indium content of between 10-40%. The indium content of the light-emitting layers may be selected at different levels depending on the emission wavelength that is desired. In preferred embodiments the light-emitting layer may have an indium content of between 12-18 %, preferably above 13 %, or an indium content between 20-30%, preferably above 22%, or an indium content between 30-40%, preferably above 33%.

The one or more light-emitting layers may have the composition In$_x$Ga$_{1-x}$N, in which $0.10 \leq x \leq 0.40$, preferably $0.12 \leq x \leq 0.18$, or $0.20 \leq x \leq 0.30$, or $0.30 \leq x \leq 0.40$.

In preferred embodiments, the light-emitting region comprises one or more InGaN quantum wells, preferably between 1 and 7 quantum wells. The thickness of each quantum well layer may vary between 1.5-8 nm.

The quantum wells may or may not be capped with a thin (0.5-3 nm) III-nitride layer.

The III-nitride barrier layer may contain one or a combination of these elements: Al, Ga, In (ternary or quaternary layer).

The quantum wells and barriers of the light-emitting region are preferably grown in a temperature range of 600-800 ° C.

The LED structure may comprise a cap layer of III-nitride material between the quantum wells and the p-doped portion, preferably in which the cap layer is undoped and has a thickness of between 5 nm and 30 nm.

The p-doped portion is overgrown above the light-emitting region, and comprises a p-doped III-nitride layer and a p-doped aluminium gallium nitride layer positioned between the p-doped III-nitride layer and the light emitting region. The p-doped aluminium gallium nitride layer is an electron-blocking-layer (EBL) between the cap layer and the p-type layer, in which the electron-blocking-layer contains 5-25 at % aluminium, preferably in which the electron-blocking-layer has a thickness of between 10 nm and 100 nm.

The p-doped III-nitride layer preferably has a p-type doping concentration of between $5\times10^{18}$ cm$^{-3}$-8$\times10^{20}$ cm$^{-3}$. The p-doped III-nitride layer may contain In and Ga, and may be between 20-200 nm thick, preferably between 50-100 nm thick. The doping concentration may vary across this layer and can have a spike in doping levels in the last 10-30 nm of the layer. For activation of Mg acceptors, the structure may be annealed inside of MOCVD reactor or in an annealing oven. The annealing temperature may be in the range of 700-850 C in N2 or in N2/O2 ambient.

As both the EBL and the p-doped layer are p-type doped, these layers may be referred to as the p-doped region.

After the n-doped portion, the light emitting region and the p-doped portion have been formed, the method may comprise the step of depositing one or more passivation layers over the LED structure and the electrically-insulating mask layer. The passivation layer is formed from a dielectric material, and covers the surfaces and sidewalls of the LED structure as well as the mask layer. The first passivation layer deposited may for example be Al$_2$O$_3$ (in a 10-100 nm thick layer) (deposited by atomic layer depositions), and this may be followed by sputtered or plasma enhanced chemical vapor deposited SiO$_2$, SiN or SiON (in a 50-300 nm thick layer). The Al$_2$O$_3$ can be deposited between 50-150 C, while the the SiO$_2$, SiN and SiON can be deposited between 250-350 C. The sputter process can be done at room temperature.

The method may comprise the further steps of removing a first portion of the passivation layer, and forming an electrical connection with the p-doped portion, and removing a second portion of the passivation region and a second portion of the mask to expose a second exposed region of the n-doped connecting layer, and forming an electrical contact in the second exposed region of the n-doped connecting layer. Portions of the passivation layer and the dielectric mask layer may be removed by wet etching, dry etching, or a combination of both. For wet etching buffered oxide etch, diluted hydrofluoric acid phosphoric acid or a mixture of these can be used.

These steps may be conducted sequentially. For example, the method may comprise the step of removing a first portion of the passivation layer, and forming an electrical contact with the p-doped portion. In preferred embodiments, a transparent conducting layer may be used to form a p-contact with the p-doped layer of the LED structure, and at least a portion of the transparent conducting layer is covered with a metal contact. This metal contact can be combination of Nickel, titanium, platinum and gold. The transparent conducting layer can be between 20-250 nm thick.

The method may comprise the further step of removing a second portion of the mask, and a second portion of the passivation layer if necessary, to expose a second exposed region of the n-doped connecting layer, and forming an electrical contact in the second exposed region of the n-doped connecting layer. An electrical contact may be formed by depositing a metal contact on the second exposed region of the n-doped connecting layer. This metal contact can be, for example, a combination of titanium, platinum and gold.

Preferred Embodiment

In a preferred embodiment, the present method of manufacturing micro-LEDs comprises the following steps:

Step 1—A Distributed Bragg Reflector (DBR) is formed on a substrate by depositing alternating layers of GaN with different charge carrier densities, and using the porosification technique set out in international patent application no PCT/GB2017/052895.

Step 2—A layer of n-(Al,In)GaN (heavily doped n-type (Al,In)GaN, such as n-GaN, n-AlGaN, or n-InGaN) is overgrown on top of the porosified DBR.

Step 3—A layer of dielectric material, for example SiO2, is deposited on the top surface of the n-GaN.

Step 4—The dielectric material is patterned by lithography, or nano imprint, or any other suitable technique, and sections of the dielectric layer are then removed by wet chemical or dry etching process. Removing some of the dielectric layer exposes a section of the underlying n-GaN. The removed area of dielectric is the shape and size of a micro-LED, for example 100 μm×100 μm or smaller.

Step 5—A Quantum Well (QW) active light emitting region (which could include multiple quantum wells) is deposited on the exposed section of n-(Al,In)GaN. The quantum wells could be InGaN, AlGaN, InN, InAlN, AlIn- GaN, while the quantum barrier surrounding the quantum well layer could be GaN, AlN, AlGaN, AlInGaN, InAlN. Quantum Wells, their structures, and their functions, are defined in international patent application no. PCT/GB2019/050213. The lateral dimensions of the QWs are the same as those of the exposed section of n-(Al,In)GaN. This means that the QW region is the size desired for a micro-LED.

Step 6—A layer of p-(Al,In)GaN (heavily doped p-type (Al,In)GaN) is deposited on the top of the Quantum Well region. The lateral dimensions of the layer of p-GaN are the same as those of the QW, and the same as the exposed section of n-GaN. The p-GaN and the QW therefore form a stack with the lateral dimensions desired for a micro-LED.

Step 7—A second layer of dielectric material, for example SiO2, is deposited on top of the first layer of dielectric, so that the second layer of dielectric covers the edges, or sidewalls, of the QW and p-(Al, In)GaN layers. This second layer of dielectric material is the passivation layer.

Step 8—An electrical p-contact is formed over the p-(Al, In)GaN so that it is in electrical contact with the layer of p-(Al,In)GaN.

Step 9—A section of the dielectric layers is removed by wet chemical or dry etching processes to expose a section of the n-(Al,In)GaN layer.

Step 10—An electrical n-contact is deposited in the exposed section of n-(Al,In)GaN so that the n-contact is in electrical contact with the n-(Al,In)GaN.

Step 11—The second layer of SiO2 is passivated with known techniques. A plasma etch is used for chip singulation and transfer.

This method means that the active QW and p-(Al,In)GaN layers of the micro-LED are not experiencing any dry etching damage. And n-contact can be made very easily.

Avoiding dry-etching damage to the active layers of the micro-LED results in significant benefits compared to micro-LEDs prepared using prior art techniques. In micro-LEDs made with prior art techniques, etching damage to the sidewalls of the p-GaN and QW layers can have a significant effect on the tiny pixels formed by micro-LEDs. This can harm the reliability and brightness of the micro-LEDs.

Micro-LEDs made using the present method are not exposed to plasma etching damage on the sidewalls of the LED stack, and so are advantageously more reliable and bright.

If desired, layers of the semiconductor structure may be porosified by electrochemical etching as set out in international patent applications PCT/GB2017/052895 (published as WO2019/063957) and PCT/GB2019/050213 (published as WO2019/145728).

The method set out above relates to a p-side light out LED configuration.

A similar method may be used to manufacture an n-side light out micro-LED by incorporating a "flip-chip" step and bonding the micro-LED to a silicon CMOS backplane. SiO2 is only an example of a dielectric suitable for masking and passivation, but other dielectrics may alternatively be used.

The layers of semiconductor material may be deposited by epitaxial growth. The layers described may be formed by molecular beam epitaxy (MBE), metalorganic chemical vapour deposition (MOCVD) (also known as metalorganic vapour phase epitaxy (MOVPE)), hydride vapour phase epitaxy (HVPE), ammonothermal processes, or other conventional processes suitable for growing III-nitride materials.

Manufacturing an Array of Micro-LEDs

According to a second aspect of the present invention there is provided a method of manufacturing an array of micro-LEDs, comprising the step of:

forming an n-doped connecting layer of III-nitride material over a porous region of III-nitride material;

forming an electrically-insulating mask layer on the n-doped III-nitride layer; removing a portion of the mask to expose an array of exposed regions of the n-doped connecting layer; and forming an LED structure on each exposed region of the n-doped connecting layer.

The method of manufacturing an array of micro-LEDs preferably comprises the method of the first aspect, in which a plurality of exposed regions of the n-doped connecting layer are formed, and a plurality of LED structures are formed in those exposed regions. By removing sections of the mask layer to expose an array of exposed regions, the layout of the micro-LED array may be designed to have the desired dimensions and density of pixels formed by the micro-LEDs.

The array of micro-LEDs may advantageously be formed on a single substrate, and the plurality of LED structures may be formed simultaneously, using deposition steps which deposit layers of semiconductor material on each exposed region of the connecting layer at the same time.

Using this method, an array of micro-LEDs may be formed without requiring any etching step to cut the LED structures to the lateral dimensions desired for individual pixels. The micro-LEDs in the array therefore avoid any etching damage to the sidewalls of the LED structure.

The method of the second aspect may advantageously include any and all of the features described above in relation to the first aspect of the invention.

Micro-LED

Another aspect of the invention relates to a micro-LED, which may be a micro-LED made by the method set out above.

According to a third aspect of the present invention there is provided a micro-LED, comprising:

an n-doped connecting layer of III-nitride material over a porous region of III-nitride material;

an electrically-insulating mask layer on the n-doped III-nitride layer; and an LED structure, in which at least a portion of the LED structure extends through a gap in the electrically-insulating mask layer, and is in contact with the n-doped connecting layer.

The micro-LED is preferably a micro-LED manufactured using the method described above in relation to the first aspect of the invention.

The porous region may be a porous layer, such that the method comprises the step of forming an n-doped connecting layer of III-nitride material over a porous layer of III-nitride material. In some embodiments, the porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The n-doped connecting layer of III-nitride material may be formed over a porous region comprising a stack of porous layers of III-nitride material.

In preferred embodiments, the n-doped connecting layer of III-nitride material is positioned over a stack of multiple porous layers of III-nitride material. Thus, rather than being a single porous layer of III-nitride material, the porous region may be a stack of layers of III-nitride material in which at least some layers are porous.

The stack of porous layers may preferably be a stack of alternating porous and non-porous layers. Preferably the stack comprises between 5 and 50 pairs of porous and non-porous layers, stacked one on top of another. The porous layers may preferably have a thickness of between 10 nm and 200 nm, and the non-porous layers may preferably have a thickness of between 5 nm and 180 nm.

Preferably the porous region, or each porous layer in the stack, has a porosity of between 10% and 90% porosity.

The micro-LED preferably comprises a non-porous intermediate layer of III-nitride material porous region between the porous region and the n-doped III-nitride connecting layer. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer may advantageously provide a smooth surface for overgrowth of the connecting layer during manufacture.

In a particularly preferred embodiment, the stack of porous layers comprises a porous Distributed Bragg Reflector (DBR), such that the n-doped connecting layer of III-nitride material is positioned over a porous DBR of III-nitride material. A porous DBR may be made up of a stack of alternating porous/non-porous layers, as the differing porosity between adjacent layers creates a difference in the refractive index of adjacent layers.

The micro-LED may comprise an intermediate layer of non-porous III-nitride material positioned between the porous region and the connecting layer. The intermediate layer preferably has a thickness of between 1 nm and 3000 nm, preferably between 5 nm and 2000 nm.

The n-doped connecting layer of III-nitride material preferably has a thickness of between 200 nm and 2000 nm. The n-doped connecting layer of III-nitride material may preferably have an n-type charge carrier concentration of at least $1 \times 10^{18}$ cm$^{-3}$.

The mask layer preferably extends over the entire surface of the n-doped connecting layer of III-nitride material, so that apart from the LED structures, the connecting layer is completely covered in dielectric material. The mask layer can be formed from SiO$_2$, SiN, SiON , AlO$_x$ or any other suitable dielectric material.

The mask layer may have a thickness of between 5 nm and 1000 nm, preferably between 200 nm and 800 nm, particularly preferably between 400 nm and 600 nm.

The LED structure may have any desired shape, as the footprint of the LED structures may be controlled during manufacturing by patterning and lithographically removing portions of the mask layer. For example, the footprints of the LED structures (seen in plan-view) may be circular, square, rectangular, hexagonal, or triangular in shape.

The LED structure has lateral dimensions that are classed as a "micro-LED". For example, the LED structure may have a width and/or length (or diameter, if the LED is circular) of between 0.05 μm and 100 μm, preferably between 0.05 μm and 30 μm, particularly preferably less than 10 μm, for example between 0.1 μm and 10 μm or between 0.5 μm and 10 μm. In preferred embodiments the LED structure may have a length, width or diameter of less than 50 μm, or less than 40 μm, or 30 μm, or 20 μm or 10 μm. Particularly preferably the LED structure may have a width or diameter of less than 10 μm, so that the LED structures form micro-LED pixels of less than 10 μm in size.

The LED structure comprises:

an n-doped portion;

a p-doped portion; and a light emitting region located between the n-doped portion and a p-doped portion.

At least a portion of the LED structure preferably extends through the electrically-insulating dielectric mask layer, so that the LED structure is in electrical contact with the n-doped connecting layer.

As explained above in relation to the first aspect of the invention, the LED structure may take a variety of different forms having layers of different thickness, composition and charge carrier concentration.

The features of the micro-LED described above in relation to the first aspect of the invention apply equally to the micro-LED of the third aspect.

The micro-LED may comprise a porous DBR.

The micro-LED may comprise an active layer which may be a Quantum Well, or a Quantum layer (for example a porosified Quantum Well containing a plurality of 3D quantum structures). The Quantum Well could be InGaN, AlGaN, InN, InAlN, AlInGaN, while the quantum barrier surrounding the quantum well layer could be GaN, AlN, AlGaN, AlInGaN, InAlN.

The micro-LED may have lateral dimensions (Length and width) smaller than 100 μm×100 μm all the way down to a few tens of nanometers or even smaller. In this context, the "height" of the LED is the dimension in the direction of intended light emission.

The micro-LED preferably comprises an active layer (which may be a quantum well) and a layer of p-GaN. The sidewalls of the active layer and the layer of p-GaN are preferably covered by a dielectric material, for example SiO2.

The micro-LED preferably comprises a first layer of dielectric material, and a second "passivation" layer of dielectric material on top of the first layer. The passivation layer of dielectric material preferably extends over the sidewalls of the active layer and the p-GaN layer.

Array of Micro-LEDs

According to a fourth aspect of the present invention there is provided an array of micro-LEDs, comprising a plurality of micro-LEDs according to the third aspect of the invention, formed on a substrate.

The array of micro-LEDs may comprise: an n-doped connecting layer of III-nitride material over a porous region of III-nitride material;

an electrically-insulating mask layer on the n-doped III-nitride layer; and a plurality of LED structures, in which at least a portion of each LED structure extends through in a gap in the electrically-insulating mask layer, and in contact with the n-doped connecting layer.

An array of micro-LEDs is an ordered series or arrangement of micro-LEDs, for example a regular formation of multiple rows and columns each containing a plurality of micro-LEDs.

The array of micro-LEDs may be an array of micro-LEDs manufactured using the method of the second aspect of the invention.

All of the features described above in relation to any of the first, second, third or fourth aspects of the invention are equally applicable to the other aspects of the invention.

BRIEF DESCRIPTION OF THE DRAWINGS

Specific embodiments of the invention will now be described with reference to the figures, in which:

FIGS. 19 to 25 illustrate a method of manufacturing a micro-LED according to a preferred embodiment of the present invention.

FIG. 1 illustrates a porous template suitable for a micro-LED according to the present invention.

The porous template comprises a porous region of III-nitride material on a substrate, with a non-porous layer of III-nitride material arranged over the top surface of the porous region. Optionally there may be further layers of III-nitride material between the substrate and the porous region.

As described in more detail above, the porous region may be provided by epitaxially growing an n-doped region of III-nitride material and then an undoped layer of III-nitride material, and porosifying the n-doped region using the porosification process as set out in international patent applications PCT/GB2017/052895 (published as WO2019/063957) and PCT/GB2019/050213 (published as WO2019/145728).

The porous region may comprise one or more layers one or more III-nitride materials, and may have a range of thicknesses. In preferred embodiments, the porous region may for example comprise GaN and/or InGaN.

In a preferred embodiment, micro-LEDs according to the present invention comprise the following layers, and may be manufactured using the step by step process described below.

The following description of the LED structure of the micro-LED relates to a Top emission architecture being described from the bottom up, but the invention is equally applicable to a bottom emission architecture.

Figure 1:
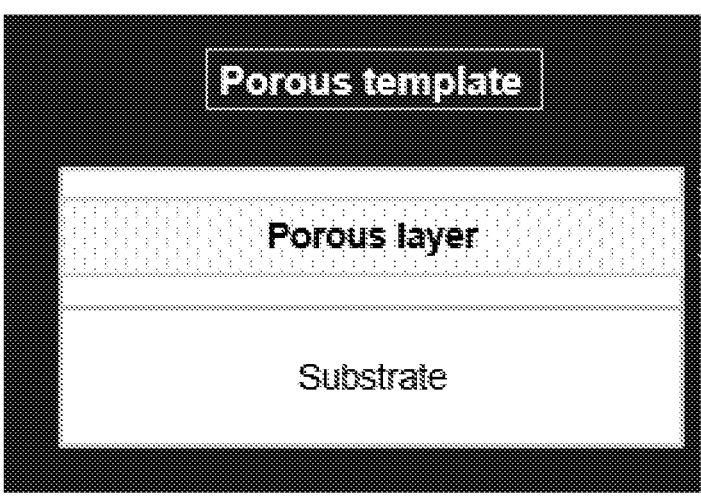
FIG. 1 illustrates a porous template suitable for a micro-LED, or an array of micro-LEDs, according to the present invention.
Figure 2:
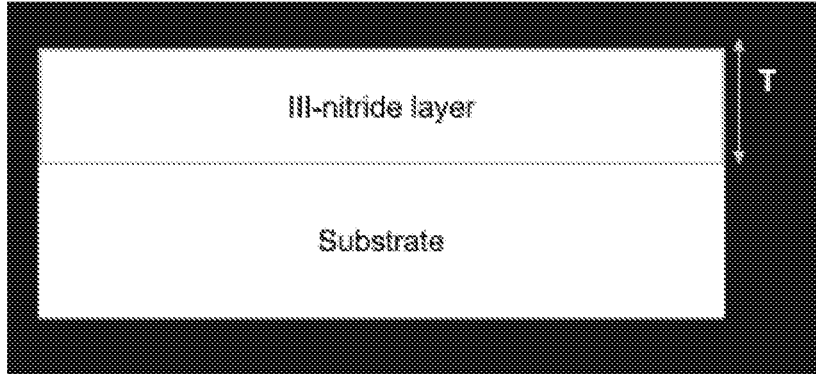
FIGS. 2-18 illustrate the steps of manufacturing an array of two micro-LEDs according to a preferred embodiment of the present invention.

FIG. 2—Substrate & III-Nitride Layer for Porosification

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 cm$^2$, 2 inch, 4 inch, 6 inch, 8 inch, 12 inch, 16 inch diameters and beyond, and the substrate may have a thickness of greater than 1 μm, for example between 1 μm and 15000 μm. Preferably the substrate is a semiconductor wafer. An advantage of the present invention is that an array of micro-LEDs may be manufactured simultaneously on a fully sized semiconductor wafer. While the illustrated example shows two micro-LEDs being formed on a shared template, the same method may be used to manufacture arrays of many micro-LEDs simultaneously on the same wafer.

A layer or stack of layers of III-nitride material is epitaxially grown on the substrate. The III-nitride layer may contain one or a combination of these elements: Al, Ga, In (binary, ternary or quaternary layer).

The thickness T of the III-nitride stack is preferably at least 10 nm, or at least 50 nm, or at least 100 nm, for example between 10-10000 nm, preferably 4000 nm.

The III-nitride layer comprises a doped region having an n-type doping concentration between $1\times10^{17}$ cm$^{-3}$-$5\times10^{20}$ cm$^{-3}$. The III-nitride layer may also comprise an undoped layer (not shown) of III-nitride material over the doped region.

The doped region may terminate at the exposed upper surface of the III-nitride layer, in which case the surface of the layer will be porosified during electrochemical etching.

Preferably, the doped region of the III-nitride material is covered by an undoped intermediate (or "cap") layer of III-nitride material, so that the doped region is sub-surface in the semiconductor structure. The sub-surface starting depth (d) of the doped region may be between 1-2000 nm for example.

In the example illustrated in FIGS. 2 to 19, the III-nitride layer that is porosified is formed by a stack of III-nitride layers of alternating highly-doped and undoped layers. Between 5 and 50 pairs of doped and undoped alternating layers preferably make up the stack, with the highly doped layers having a charge carrier concentration of around $1\times10^{20}$ cm$^{-3}$, and the undoped layers having a charge carrier concentration of around $1\times10^{17}$ cm$^{-3}$. The thickness of the highly doped layers is preferably between 10 nm and 200 nm and the thickness of the undoped layers is preferably between 5 and 180 nm.

Figure 3:
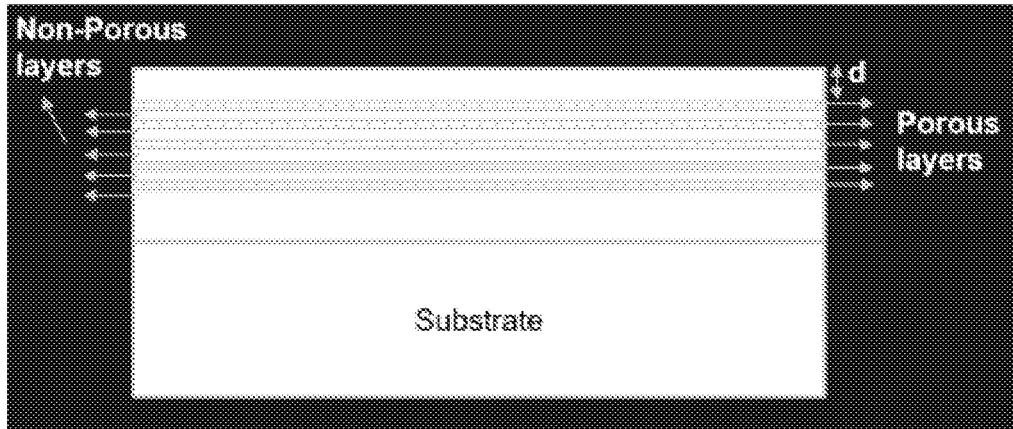

FIG. 3—Porosification to Porous Layer

After it is deposited on the substrate, the III-nitride stack of layers is porosified with a wafer scale porosification process as set out in international patent applications PCT/GB2017/052895 (published as WO2019/063957) and PCT/GB2019/050213 (published as WO2019/145728). During this process, the doped layers of the III-nitride stack become porous, while any undoped region of III-nitride material does not become porous. The degree is porosity of the porous layers is controlled by the electrochemical etching process and may preferably be between 10%-90%.

Following the porosification step, the structure therefore contains a non-porous intermediate layer overlying a stack of alternating porous and non-porous layers. The stack of alternating porous and non-porous layers forms a DBR, as discussed above. As the uppermost layer of the stack is non-porous, this layer is not porosified, and remains on top of the stack as a non-porous intermediate layer.

Figure 4:
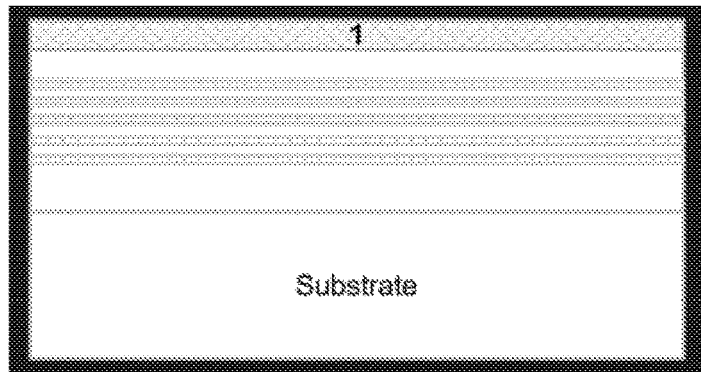
Figure 5:
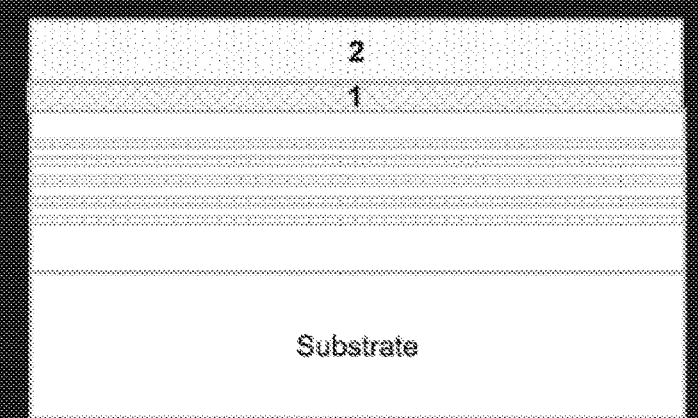

FIG. 4—Connecting Layer

As shown in FIG. 3, after porosification, the wafer is overgrown with a connecting layer 1. The connecting layer is a n-doped III-nitride (preferably GaN) layer with a thickness of between 200 and 2000 nm (layer 1 in FIG. 3), and an n-type charge carrier concentration of at least >$1\times10^{18}$ cm$^{-3}$.

The connecting layer 1 is formed of III-nitride material and may contain one or a combination of these elements: Al, Ga, In (binary, ternary or quaternary layer). The connecting layer is doped with suitable n-type dopant materials , e.g Si, Ge, C, O.

FIG. 5—Mask Layer

An electrically-insulating mask layer 2 is then deposited on the wafer surface, to cover the connecting layer 1. The purpose of the mask layer 2 is to protect certain regions of the wafer in the next steps as a mask and to enable selective area epitaxy on top of this template.

This mask layer 2 can be SiO$_2$, SiN , SiON , AlO$_x$ or any other suitable layer. The thickness of this layer can be between 5-1000 nm, preferably around 500 nm.

The method used for deposition of this layer can be PECVD, sputtering, ALD, evaporation or an in-situ MOCVD approach.

Figure 6:
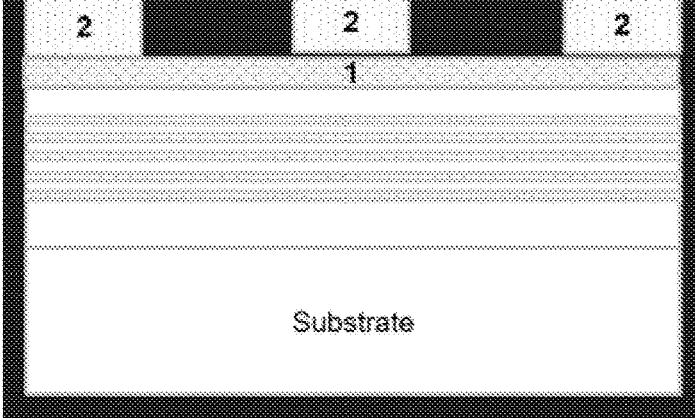

FIG. 6—Exposing Regions of the Connecting Layer

Standard lithographic techniques are used to create openings in the non-conducting mask layer 2. The openings can be created either with a wet etching or a dry etching method.

In a particularly preferred example inductively coupled dry etching (ICP-RIE) is used to remove SiO$_2$ from two areas, which creates two exposed regions on the surface of the connecting layer 1 that are no longer covered by the mask layer 2.

The shape of the exposed regions can be circular, square, rectangular, hexagonal, triangular etc. The width or diameter of the openings are preferably less than 100 μm so that the LED structures formed on the exposed areas are classed as micro-LEDs. The exposed regions may preferably have a width of 0.05 μm-30 μm, particularly preferably of 10 μm or less.

These exposed regions will eventually become pLED pixels

Figure 7:
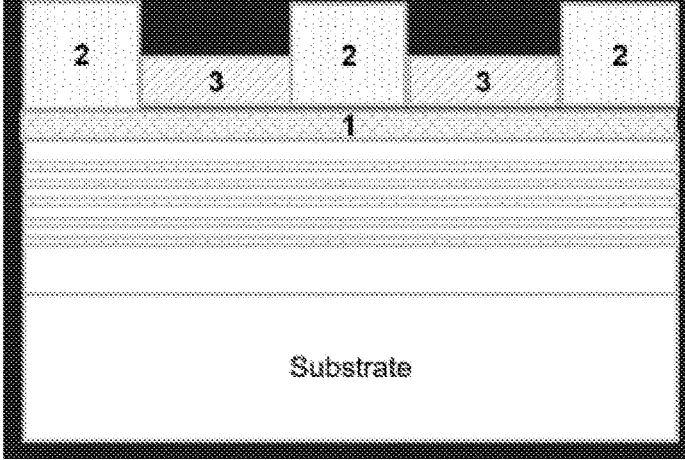
Figure 8:
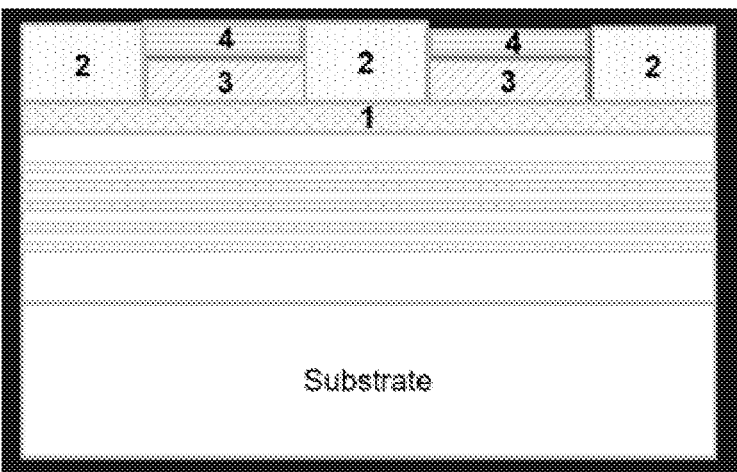

FIGS. 7 & 8—N-doped Region

After the exposed regions of the connecting layer 1 are formed, an n-doped layer 3 of III-nitride material is deposited in the exposed regions.

In the particular example shown, a 400 nm thick n-doped GaN layer (layer 3) is grown by MOCVD. The growth takes place only inside the exposed regions, on the surface of the n-doped connecting layer 1. Si is used as a dopant in the n-doped layer 3, with a doping concentration of at least >1×10$^{19}$ cm$^{-3}$.

After the growth of n-doped layer 3, a bulk III-nitride layer 4 containing Indium or a stack of thin III-nitride layers with or without indium, or a variation in atomic percentage of indium is across the bulk layer or the stack is grown. The Indium atomic percentage may vary between 0.5-25%. The total thickness may vary between 2 nm-200 nm. If the stack is used then the thickness of individual layer in the stack may vary between 1-40 nm. The layer 4 may have n-doping concentration between 1×10$^{17}$ cm$^{-3}$-5×10$^{20}$ cm$^{-3}$.

Figure 9:
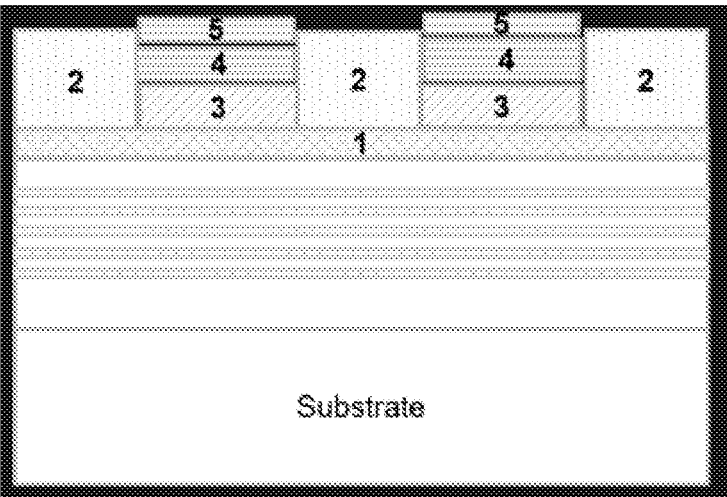

FIG. 9—Light Emitting Region

After growth of n-type layer 4, a light-emitting region 5 is grown.

The light-emitting region 5 may contain at least one light emitting layer. Each light emitting layer may be a quantum well (QVV), preferably an InGaN quantum well (QVV). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800 ° C.

Each quantum well preferably consists of an InGaN layer with atomic indium percentage between 10-40%. In specific examples the atomic indium content is between 12-18%, preferably above 13%, or between 20-30%, preferably above 22%, or between 30-40%, preferably above 33%.

The thickness of each quantum well layer may be between 1.5-8 nm, preferably between 1.5 nm and 6 nm, or between 1.5 nm and 4 nm.

The quantum wells may or may not be capped with a thin (0.5-3 nm) III-nitride QW capping layer, which may contain one or a combination of these elements: Al, Ga, In (ternary of quaternary layer).

The QW capping layer, which (if present) is the layer added immediately after QW growth, can be AlN, AlGaN of any Al % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer).

The QW capping layer(s) and QW barriers are not indicated with individual reference numerals in the Figures, as these layers form part of the light emitting region 5.

Figure 10:
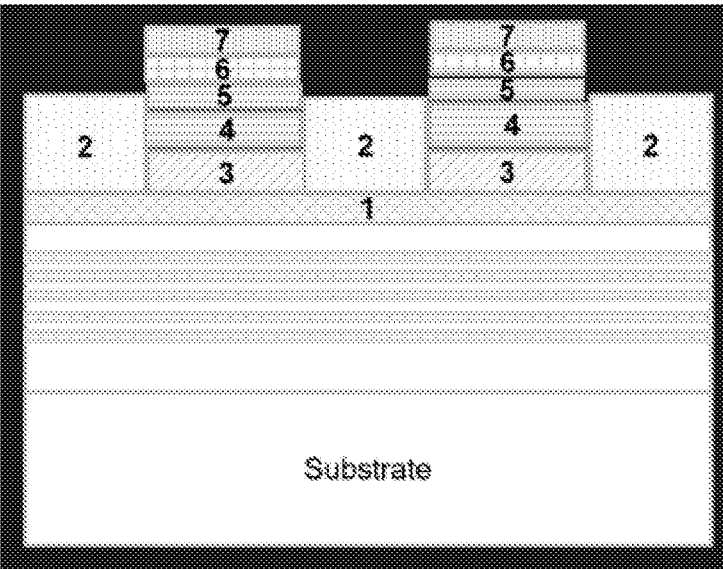

FIG. 10—Capped Layer and EBL

After growth of quantum wells a non-doped cap layer 6 is grown. Non-doped cap layer 4 may be termed a light-emitting-region cap layer, as this layer is formed after growth of the complete light emitting region, for example after the growth of the stack of QWs, QW capping layers and QW barrier layers.

The cap layer (light-emitting-region cap layer) 6 is a standard layer which is very well known in the growth schemes for III-nitride LEDs.

The thickness of cap layer can be between 5-30 nm, preferably between 5-25 nm or 5-20 nm.

Electron Blocking Layer (EBL)

After the cap layer 6, an electron blocking III-nitride layer 7 (EBL) containing Aluminium is grown. The thickness is of EBL can be between 10-100 nm. The Al % can be between 5-25% for example, though higher Al content is possible.

The EBL is doped with a suitable p-type doping material. The doping concentration can be between 5×10$^{18}$ cm$^{-3}$-8×10$^{20}$ cm$^{-3}$.

Figure 11:
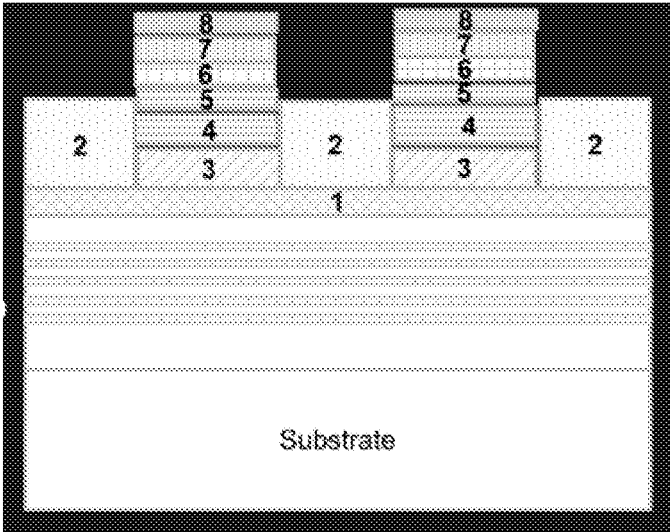

FIG. 11—P-doped Layer

A p-doped layer 8 is grown above the electron blocking layer (EBL) 7.

The p-type region is preferably doped with Mg, and the p-type doping concentration of the p-type layer is preferably between 5×10$^{18}$ cm$^{-3}$-8×10$^{20}$ cm$^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850 C in N2 or in N2/O2 ambient.

As both the EBL and the p-doped layer are p-type doped, these layers may be referred to as the p-doped region.

Figure 12:
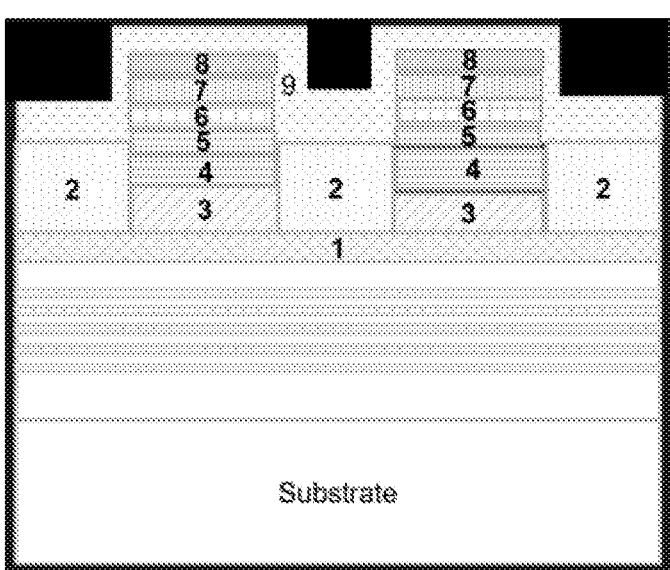

FIG. 12—Passivation Layer

The next step is to deposit a passivation layer 9 or a combination of passivation layers. The starting passivation layer can be Al$_2$O$_3$ (10-100 nm) (deposited by atomic layer depositions) followed by sputtered or plasma enhanced chemical vapor deposited SiO$_2$, SiN or SiON (50-300 nm).

The Al$_2$O$_3$ can be deposited between 50-150 C. The SiO$_2$, SiN and SiON can be deposited between 250-350 C. The sputter process can done at room temperature.

In a particularly preferred example the passivation layer 9 is made up of a 30 nm thick Al$_2$O$_3$ layer and 200 nm thick SiO$_2$ layer.

Figure 13:
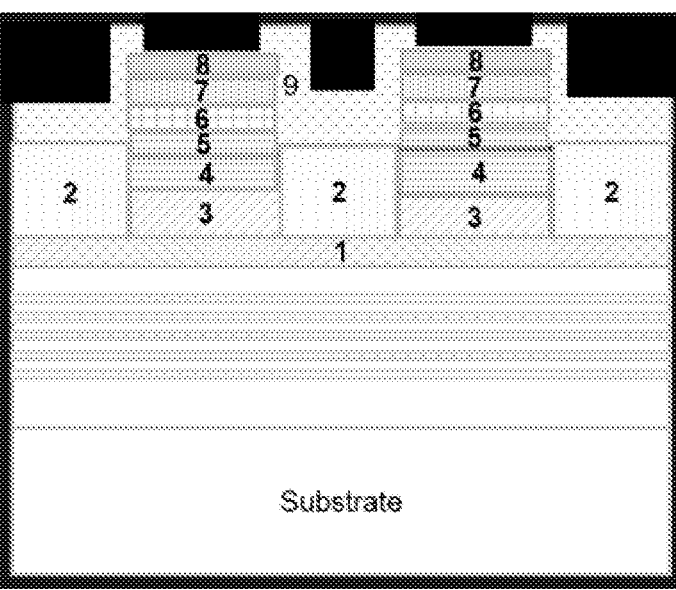

FIGS. 13—Openings in Passivation Layer

The next step is to create openings in the dielectric layers to expose the p- and n-GaN. This can be done via wet etching, dry etching, or a combination of both. For wet etching buffered oxide etch, diluted hydrofluoric acid phosphoric acid or a mixture of these can be used.

In the topology illustrated in the Figures, two separate lithography steps are used to form ohmic contact on p and n doped layers.

FIG. 13 shows openings created through the passivation layer 9 to expose a region of the p-type layer 8.

Figure 14:
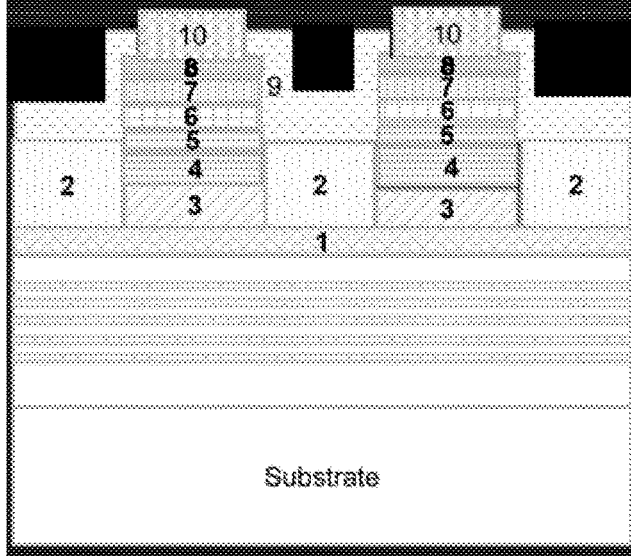

FIG. 14—Transparent Conducting Layer

The exposed region of the p-type layer 8 is then covered with a transparent conducting layer 10. The transparent conducting layer can be made of Ni/Au, indium tin oxide, indium zinc oxide, graphene, Pd, Rh, silver, ZnO etc., or a combination of these materials.

The thickness of the transparent conducting layer can typically be between 10-250 nm.

Transparent conducting layers are well known in the art, and any suitable material and thickness may be used.

An annealing step may be required for making the p-contact ohmic.

Figure 15:
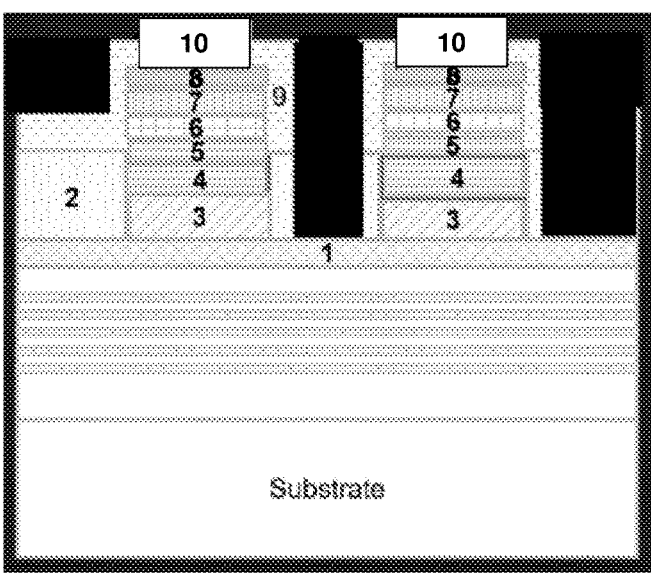
Figure 16:
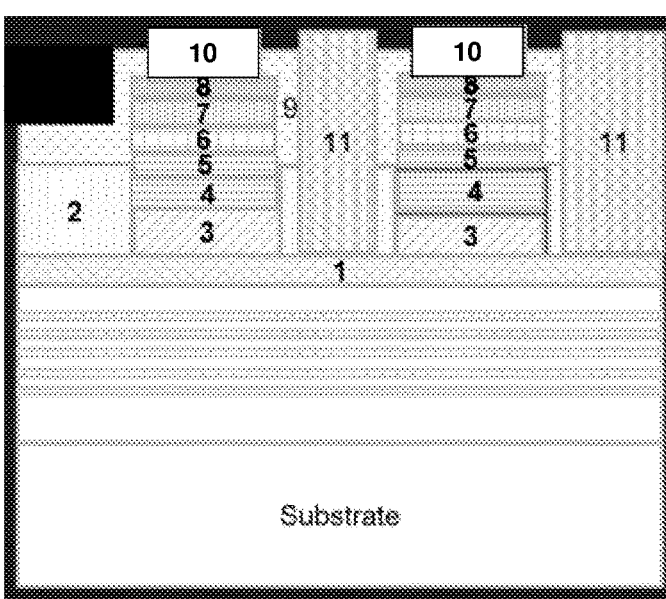

FIG. 15—Second Exposed Region

The next step is to create openings to expose second exposed regions of the n-doped connecting layer 1, so that electrical connections can be made to the connecting layer 1. This is done by removing a portion of the passivation layer 9 and the mask layer 2. This can be done via wet etching, dry etching, or a combination of both.

FIG. 16—N-Contact

A metal n-contact 11 is deposited on the second exposed regions of the n-doped connecting layer 1. This metal contact can be combination of titanium, platinum and gold.

FIG. 17—P-Contact

Figure 17:
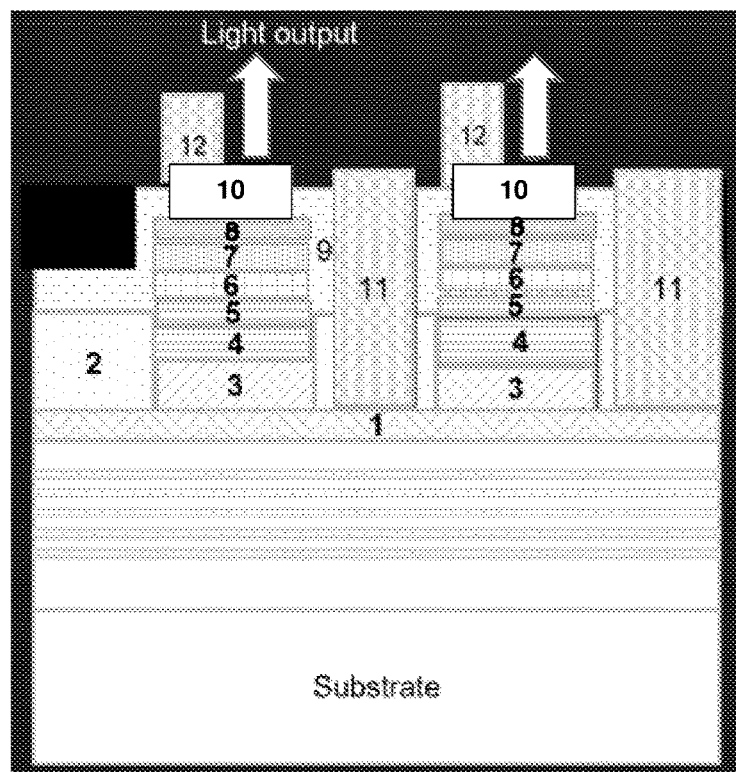
Figure 18:
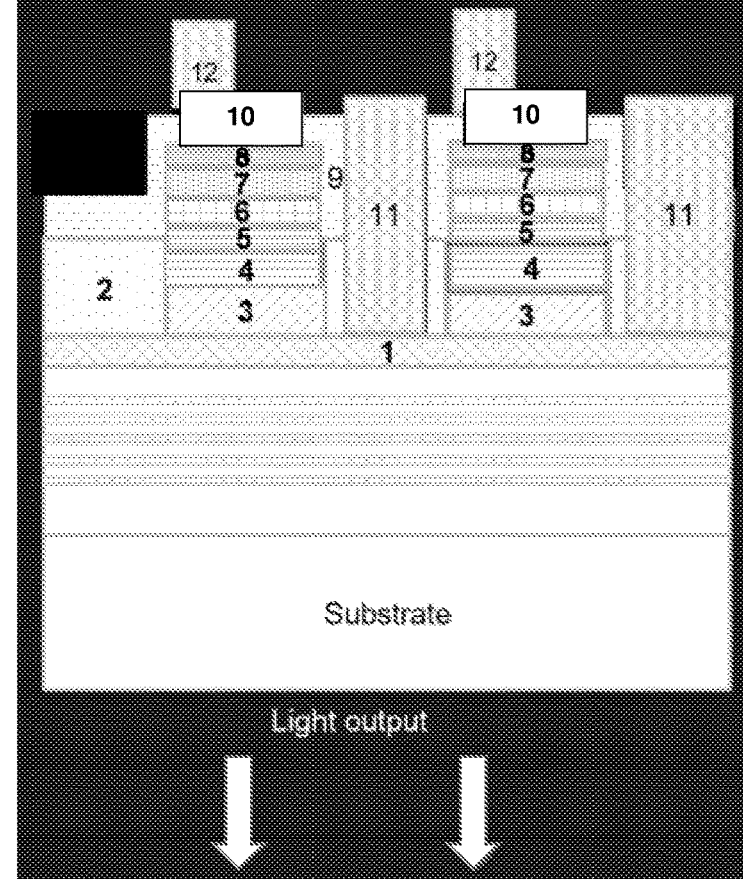

In the final step only a portion of ITO is covered with a metal p-contact 12. This is used in a topology where light is extracted out from p-side, as shown in FIG. 17.

This metal contact can be combination of Nickel, titanium, platinum and gold.

Micro-LED—Specific Example

A particular preferred example of a micro-LED according to the present invention can be manufactured according to the steps set out above. The details of the layers in the exemplary micro-LED structure are as follows:

Substrate: 4 inch diameter planar sapphire substrate, under 1 $\mu$m thick undoped GaN buffer layer;

Porous Stack: 15 pair stack of alternating layers of undoped GaN layers (thickness 45 nm) and Si doped n+ GaN layers (thickness 62.5 nm) with a charge carrier concentration of $>1\times10^{19}$ cm$^{-3}$, electrochemically porosified so that the n-doped layers are porous and the undoped layers (including the top-most layer in the stack) are non-porous;

Connecting Layer 1 (the layer overgrown on top of the non-porous/porous template): n-doped GaN layer, thickness of 500 nm, Si doped with a charge carrier concentration of $>5\times10^{18}$ cm$^{-3}$;

Mask Layer 2: 500 nm thick SiO$_2$ layer deposited vie PECVD;

Exposed Regions: inductively coupled dry etching (ICP-RIE) was used to remove SiO$_2$ from designated areas to expose circular exposed regions with a diameter of 10 $\mu$m;

N-doped Layer 3: 400 nm thick n-doped GaN (Si dopant) layer, grown in MOCVD, doping concentration of at least $>1\times10^{19}$ cm$^{-3}$;

N-type Layer 4: stack of layers with atomic indium content of less than 5%, total stack thickness of 120 nm and doping concertation of mid $1\times10^{18}$ cm$^{-3}$;

Light-Emitting Region 5: 5 InGaN QWs (indium content of 17.5 at. %) with PL emission wavelength between 440-465 nm; GaN as a barrier layer, no capping layer;

Capping layer 6: 20 nm thick GaN;

EBL 7: AlGaN containing 15% Al, with a thickness of 60 nm;

P-doped Layer 8: p-GaN layer, thickness of 50 nm, Mg doped with p-type charge carrier concentration of $>1\times10^{19}$cm$^{-3}$, followed by a layer of p++GaN, thickness of 6 nm, Mg doped with p-type charge carrier concentration of $>1\times10^{20}$ cm$^{-3}$;

Passivation Layer 9: 30 nm thick Al$_2$O$_3$ and 200 nm thick SiO$_2$ layers;

Transparent conducting layer 10: ITO, thickness of 150 nm;

Metal contact 11 to n-doped layer: 50 nm Ti, 100 nm Pt and 500 nm Au;

Metal contact 12 to p-type layer: 2 nm Ni, 50 nm Ti, 100 nm Pt and 500 nm Au.

The illustrated micro-LED in FIGS. 2-17 is designed to have an emission wavelength between 440-465 nm, and to emit light from the p-side of the device (the top of the micro-LED as shown). The stack of porous/non-porous layers forms a DBR that exhibits >90% reflectivity/transmission at ~450 nm, so the DBR acts as a reflective mirror under the micro-LED that enhances the brightness of the emitted light. Both the emission wavelength of the light-emitting region, and the wavelength reflected by DBR, may be tuned as desired to obtain LEDs of other colours.

FIG. 19—Bottom-Side Topology

FIG. 19 illustrates an alternative micro-LED topology in which the light is being extracted out of the bottom side (substrate side).

The stack of porous/non porous layers can be used to form a DBR for which the reflectivity is >90% in a wavelength range of, for example, 440-465 nm.

In an exemplary embodiment, the QWs are chosen to have an emission wavelength of between 520-540 nm. The manufacture steps described above in relation to FIGS. 2 to 17 also apply to this embodiment, except that the n-type underlayer 3 and the light-emitting region 5 is appropriately adjusted for the desired output wavelength.

This bottom-side emission topology will offer following benefits:

Pure green light is transmitted through the DBR and out of the device, as any other wavelength below 520 nm is blocked and reflected due to the DBR design;

No damage to sidewalls of pixel during manufacture, hence no performance degradation for micro pixels.

Preferred Embodiment

FIGS. 19 to 25 illustrate a method of manufacturing a micro-LED according to a preferred embodiment of the present invention.

FIG. 19—A DBR is formed on a substrate using the porosification technique set out in Cambridge Enterprise's pending patent application no PCT/GB2017/052895. A layer of n-GaN is deposited on top of the porosified DBR.

FIG. 20—A layer of SiO2 (or another dielectric material) is deposited on the top surface of the n-GaN.

FIG. 21—The SiO2 is patterned by lithography, and a section of the SiO2 with lateral dimensions of 50 $\mu$m×50 $\mu$m is removed by wet chemical or dry etching process.

Figures 22, 23, 24, 25:
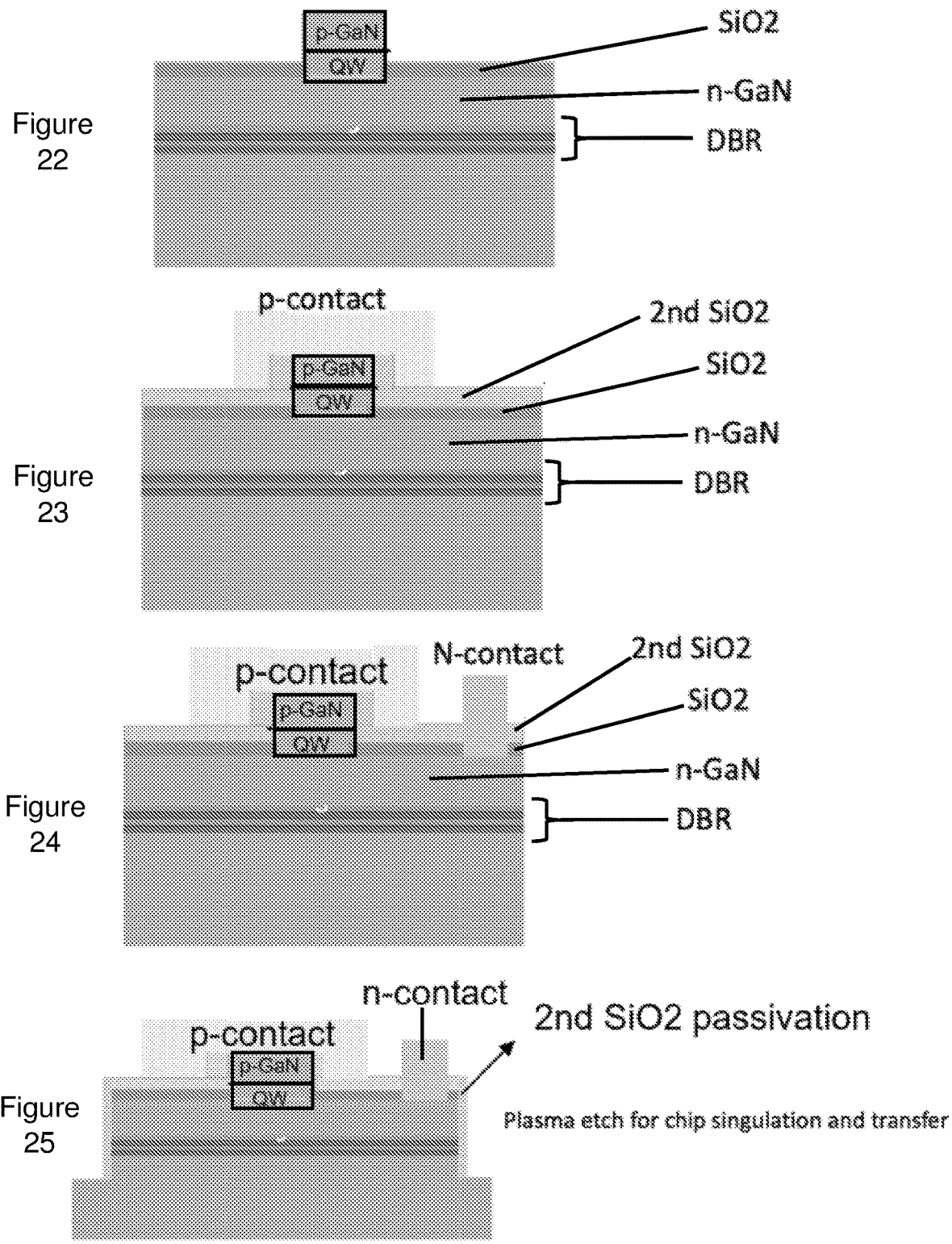

FIG. 22—A Quantum Well made from one of InGaN, AlGaN, InN, InAlN, AlInGaN, and surrounded by quantum barriers of GaN, AlN, AlGaN, AlInGaN, InAlN, is deposited on the exposed section of n-GaN. A layer of p-GaN is deposited on top of the QW.

FIG. 23—A second layer of SiO2 is deposited on top of the first layer of SiO2, so that SiO2 covers the edges of the QW and p-GaN layers. An electrical p-contact is formed over the p-GaN so that it is in electrical contact with the layer of p-GaN. This second SiO2 layer is the passivation layer.

FIG. 24—A section of SiO2 is removed by wet chemical or dry etching processes to expose a section of the n-GaN layer, and an electrical n-contact is deposited in the exposed section so that it is in electrical contact with the n-GaN.

FIG. 25—The second layer of SiO2 is passivated with known techniques. A plasma etch is used for chip singulation and transfer.

The invention claimed is:

1. A method of manufacturing a micro-LED, comprising the steps of:
   forming an n-doped connecting layer of III-nitride material over a porous region of III-nitride material;
   forming an electrically-insulating mask layer on the n-doped connecting layer;
   removing only a portion of the electrically-insulating mask layer to expose an exposed region of the n-doped connecting layer, such that the exposed region is an opening in the electrically-insulating mask layer; and
   forming an LED structure on the exposed region of the n-doped connecting layer.

2. A method according to claim 1, comprising the first step of electrochemically porosifying a region of III-nitride material, to form the porous region of III-nitride material.

3. A method according to claim 1, comprising the step of forming the porous region of III-nitride material by electrochemical porosification through a non-porous layer of III-nitride material, such that the non-porous layer of III-nitride material forms a non-porous intermediate layer between the porous region and the n-doped III-nitride connecting layer, optionally in which the non-porous intermediate layer has a thickness of between 1 nm and 3000 nm.

4. A method according to claim 1, in which the n-doped connecting layer of III-nitride material is formed over a stack of multiple porous layers of III-nitride material, optionally in which the stack of porous layers comprises a porous Distributed Bragg Reflector (DBR), such that the method comprises the step of forming an n-doped connecting layer of III-nitride material over a porous DBR of III-nitride material.

5. A method according to claim 4, in which the stack of porous layers is a stack of alternating porous and non-porous layers, optionally in which the porous layers have a thickness of between 10 nm and 200 nm, and the non-porous layers have a thickness of between 5 nm and 180 nm.

6. A method according to claim 1, in which the porous region or each porous layer has a porosity of between 10% and 90% porous, and/or in which the n-doped connecting layer of III-nitride material has a thickness of between 200 nm and 2000 nm and a charge carrier concentration of $>1\times10^{18}$ cm$^{-3}$.

7. A method according to claim 1, in which the mask layer is formed from one of: $SiO_2$, SIN, SiON, $AlO_x$.

8. A method according to claim 1, in which the mask layer has a thickness of between 5 nm and 1000 nm.

9. A method according to claim 1, in which the exposed regions of the connecting layer are circular, square, rectangular, hexagonal, or triangular in shape.

10. A method according to claim 1, comprising the step of, after the n-doped portion, the light emitting region and the p-doped portion have been formed, removing a second portion of the mask to expose a second exposed region of the n-doped connecting layer; and
   forming an electrical contact in the second exposed region of the n-doped connecting layer.

11. A method according to claim 1, in which the exposed region has a width and length of between 0.05 μm and 100 μm.

12. A method according to claim 1, in which the step of forming the LED structure comprises forming, on the exposed region of the n-doped connecting layer:
   an n-doped portion;
   a p-doped portion; and
   a light emitting region located between the n-doped portion and a p-doped portion;
   in which the light-emitting region comprises one or more III-nitride light-emitting layers, and in which the or each light-emitting layer comprises a nanostructured layer comprising fragmented or discontinuous quantum wells.

13. A method of manufacturing an array of micro-LEDs, comprising:
   forming an n-doped connecting layer of III-nitride material over a porous region of III-nitride material;
   forming an electrically-insulating mask layer on the n-doped III-nitride layer;
   removing only a portion of the electrically-insulating mask layer to expose an array of exposed regions of the n-doped connecting layer, such that the exposed regions are openings in the electrically-insulating mask layer; and
   forming an LED structure on each exposed region of the n-doped connecting layer.

14. A micro-LED, comprising:
   an n-doped connecting layer of III-nitride material over a porous region of III-nitride material;
   an electrically-insulating mask layer on the n-doped connecting layer of III-nitride material; and
   an LED structure,
   in which at least a portion of the LED structure extends through a gap in the electrically-insulating mask layer, and is in contact with the n-doped connecting layer of III-nitride material.

15. A micro-LED according to claim 14, in which the LED structure comprises:
   an n-doped portion;
   a p-doped portion; and
   a light emitting region located between the n-doped portion and a p-doped portion, optionally in which the n-doped portion comprises an n-doped III-nitride layer.

16. A micro-LED according to claim 15, in which the light-emitting region comprises one or more III-nitride light-emitting layers, and in which the or each light-emitting layer comprises a quantum well.

17. A micro-LED according to claim 16, in which the or each light-emitting layer comprises a III-nitride material with an atomic indium content of between 10-40%, or between 12-18%, or between 20-30%, or between 30-40%, and/or in which the one or more light-emitting layers have the composition $In_xGa_{1-x}N$, in which $0.10\leq x\leq0.40$.

18. A micro-LED according to claim 15, in which the light-emitting region comprises one or more InGaN quantum wells, and/or in which the LED comprises a cap layer of III-nitride material between the quantum wells and the p-doped portion.

19. A micro-LED according to claim 15, in which the p-doped portion comprises a p-doped III-nitride layer and a p-doped aluminium gallium nitride layer positioned between the p-doped III-nitride layer and the light emitting region, optionally in which the p-doped aluminium nitride layer is an electron-blocking-layer (EBL) between the cap layer and the p-type layer, in which the electron-blocking-layer contains 5-25 at % aluminium.

20. An array of micro-LEDs, comprising a plurality of micro-LEDs according to claim 15, formed on a substrate.

21. A micro-LED according to claim 15, in which the light-emitting region comprises one or more III-nitride light-emitting layers, and in which the or each light-emitting layer comprises a nanostructured layer comprising fragmented or discontinuous quantum wells.

22. A micro-LED according to claim 14, comprising a non-porous intermediate layer of III-nitride material positioned between the porous region and the connecting layer.

23. An array of micro-LEDs, comprising:

an n-doped connecting layer of III-nitride material over a porous region of III-nitride material;

an electrically-insulating mask layer on the n-doped connecting layer of III-nitride material;

a plurality of gaps in the electrically-insulating mask layer, and a plurality of LED structures, in which at least a portion of each LED structure extends through a gap in the electrically-insulating mask layer, and is in contact with the n-doped connecting layer of III-nitride material.

\* \* \* \* \*